United States Patent [19]  [11] 3,980,917
Kakizaki et al.  [45] Sept. 14, 1976

[54] PHOTO-ELECTRODE STRUCTURE

[75] Inventors: Takehiro Kakizaki, Yokohama; Yasuharu Kubota, Fujisawa, both of Japan

[73] Assignee: Sony Corporation, Tokyo, Japan

[22] Filed: May 6, 1975

[21] Appl. No.: 575,027

[30] Foreign Application Priority Data
May 23, 1974 Japan.......................... 49-59232[U]

[52] U.S. Cl.................................. 313/383; 313/390; 174/50.61; 313/482
[51] Int. Cl.²..................... H01J 29/02; H01J 29/08; H01J 31/46; H01J 29/90
[58] Field of Search .............. 358/46; 313/365, 383, 313/390, 477, 482; 174/50.61

[56] References Cited
UNITED STATES PATENTS 3,721,752  3/1973  Kakizaki et al........................ 358/46
3,854,069  12/1974  Tagawa........................... 313/365 X

*Primary Examiner*—Robert Segal
*Attorney, Agent, or Firm*—Lewis H. Eslinger; Alvin Sinderbrand

[57] ABSTRACT

An electrode structure includes a pin that extends through a hole in a fragile substrate, such as a thin, glass plate, and makes contact with a conductive layer on one surface of the plate. The structure includes a first metallic adherent layer on that portion of the conductive layer and a second metal layer on the exposed surface of the first metal layer. The hole extends through the conductive layer and both of the metal layers. The first metal layer is adherent to the conductive layer and consists of iron, chromium, or nickel, for example, deposited on the conductive layer. The second metal layer is a fixative for the first layer and is wettable by soft solder. It consists of a noble metal from the group consisting of gold, silver, platinum and paladium. The pin has a head larger than the cross-section of the hole and a surface that is wettable by soft solder. A ring of soft solder encircles the pin and is solidified into joining relationship between the surface of the pin and the adjacent surrounding surface of the second metal layer to form a hermetic seal and an electrical connection between the pin and the second metal layer. The solder ring may be placed on the pin as a separate element, and its temperature may be raised to the molten state by heat treatment of the entire assembly, after which the solder resolidifies upon cooling.

6 Claims, 4 Drawing Figures

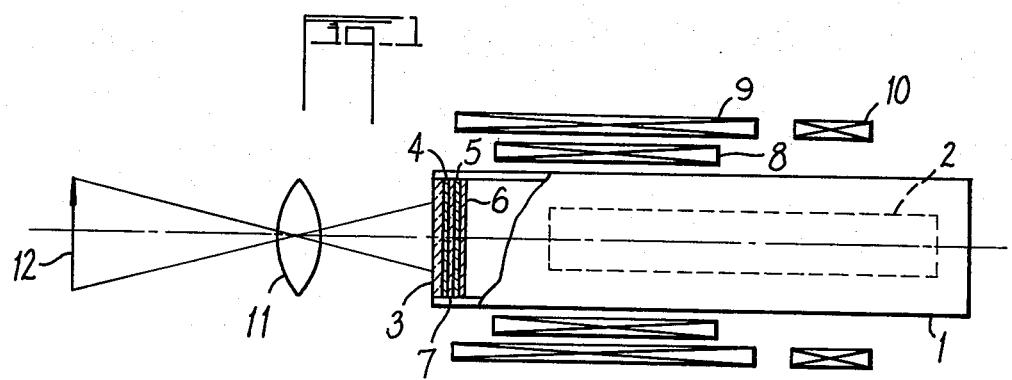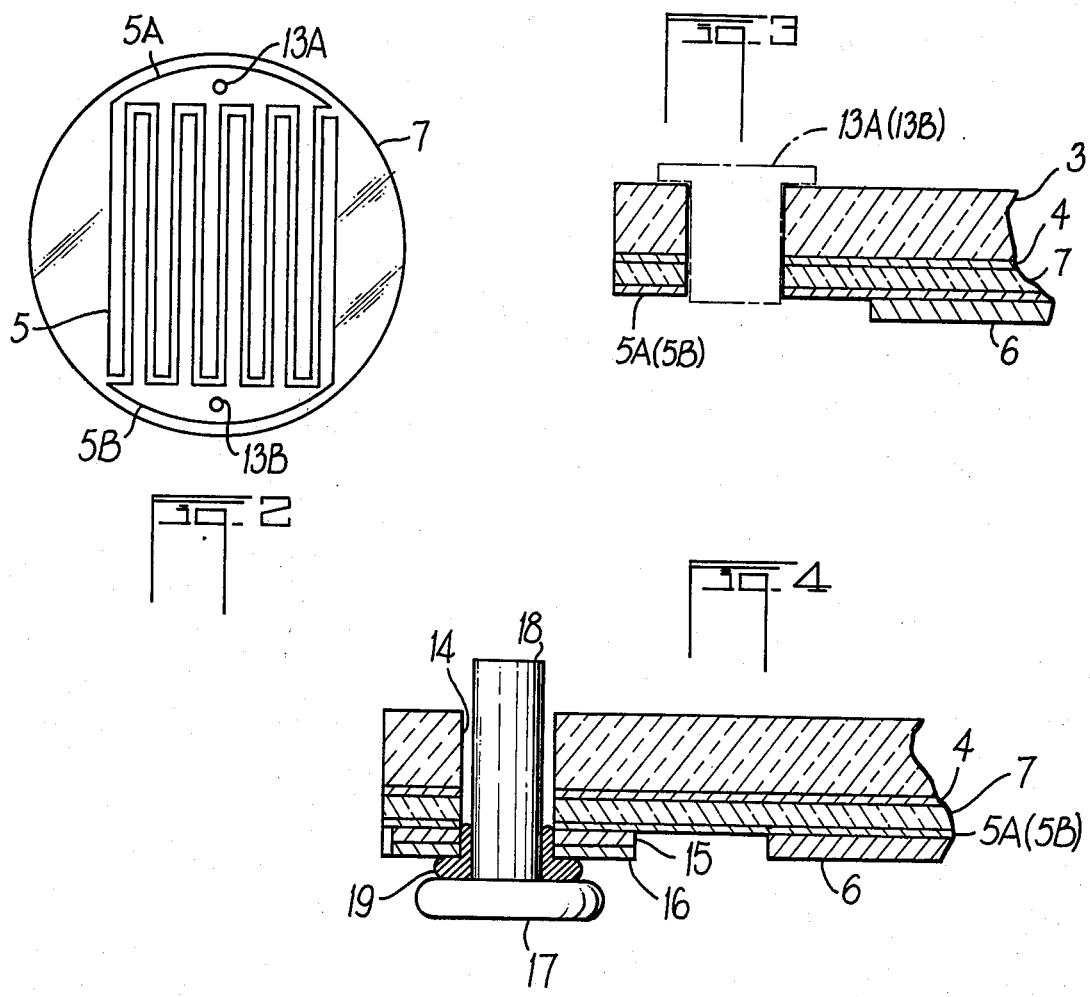

PHOTO-ELECTRODE STRUCTURE

BACKGROUND OF THE INVENTION

1. Field of the Invention

The present invention relates to an electrode structure including an electrical contact and to a method for making the structure, including attachment of the contact to the structure. In particular, the invention relates to an electrode structure for use in a color television pick-up tube and to a contact to be assembled with the electrode structure to provide a hermetically sealed connection to a transparent electrode on the interior surface of the front face of a television pick-up tube.

2. The Prior Art

In some types of television image pick-up tubes a transparent electrode is disposed on the inner glass surface of the faceplate of the tube, and an electrical contact extends through the glass face to connect with the transparent electrode. Such tubes are shown and described, for example, in U.S. Pat. Nos. 3,688,020 and 3,740,458. The faceplates of these tubes are multi-layer structures that include extremely thin and fragile glass plates, and there are two electrodes on the inner surface of the faceplate. The conductive means to carry signals through the tube wall to the electrode or electrodes is most conveniently arranged to pass through the faceplate, itself, rather than to be located on the cylindrical side wall or the base of the tube.

It is mandatory that the conductive means be hermetically sealed to the faceplate so that no air can enter the highly evacuated tube by any passageway alongside the conductive structure. The conductive structure must also make good electrical contact with the internal electrodes and must not include any substances that may interact deleteriously with any of the internal structure of the tube.

Various conductive means and methods of assembly exist for establishing a hermetically sealed electrical connection through a plate of glass or other transparent material to make contact with an electrode structure on the interior of an envelope of which the transparent plate forms one section. One such conductive means is a glazed contact wire inserted through a hole bored through an unpolished glass faceplate. The method of assembly is to heat the glazed contact wire to fuse it to the faceplate. Thereafter, the external surface of the plate is ground smooth. This grinding of the faceplate also includes grinding the wire off flush with the surface of the plate, but electrical contact can still be made to the exposed surface of the fused wire. A Nesa coating is applied to the other surface and is directly in contact with the contact wire.

Problems exist with such a method, however. The deposition process for a Nesa layer is strongly corrosive, and, therefore, the fused contact wire is likely to be chemically attacked. Furthermore, the corrosive Nesa layer can creep into the inner space between the glass and the fused wire and oxidize the surface of the wire to such an extent that the wire becomes unusable. Furthermore, such fused wire connections are expensive and often are not vacuum-tight.

Another method described in U.S. Pat. No. 3,675,062 allows a connection to be made to the interior conductive Nesa layer by drilling a hole through the glass faceplate and depositing the Nesa layer not only on the interior surface of the faceplate but also on at least a portion of the hole extending through it. Thereafter, an indium plug is inserted into the hole from the front side to make contact with the Nesa layer. In order to prevent the subsequent corrosion of the indium plug from the outside, it is necessary to cover the exterior end of the plug with a protective material such as a synthetic resin and then to use a device that resembles a sharp-pointed steel tack to pierce the resin and the end of the indium plug.

The latter structure and method are relatively complicated since the steps are not suited to automatic, machine-operated procedures. This results in poor quality control. Also, it is usually necessary to counter-sink the bore in the glass plate in order to provide suitable anchorage for the indium plug. However, grinding the faceplate to provide for counter-sinking may cause cracks to appear in the glass faceplate surface.

Another structure and method for providing a feed-through connection in a glass faceplate of a television pick-up tube are shown in U.S. Pat. No. 3,721,752 in which copper posts of cylindrical shape are inserted in holes in the faceplate and are sealed in place by indium bushings. The bushings also make electrical contact with electrodes previously deposited on the faceplate.

The latter structure gives rise to manufacturing problems, especially with respect to hermetic sealing.

U.S. Pat. No. 3,854,069 describes an improved contact structure and method of forming the same. The structure includes a post, the main portion of which is coated with a deformable metal, such as indium. The coated main portion of the metal post is inserted into a hole in the faceplate. A portion of the coating on the end of the metal post adjacent to the inner surface of the faceplate assembly is deformed to contact the electrode and to provide a hermetic seal against the electrode and the faceplate assembly interior surface. The enlarged head portion of the metal post is adjacent the exterior surface of the faceplate assembly, and in some embodiments the end of the metal post which is adjacent the interior surfaces of the faceplate assembly is covered with a photoconductive layer.

The process for coating the metal post with the deformable metal is to dip the metal post, which may be made of copper, into a heated bath which consists of a lower layer of liquid indium covered by an upper layer of non-volatilized glycerine or other type of alcohol compound having a high surface tension, and then quickly withdrawing the indium-coated post. Prior to the coating the metal post is prepared by stripping away its oxide layer with an acid, such as hydrochloric acid. When the metal post is lifted from the bath the indium adheres to the post but due to the surface tension of the glycerine the indium coating on the post is tapered at its lower end. The orientation of the post is such that the lower end corresponds to the main portion of the post whose diameter is less than the diameter of the faceplate hole. Then the tapered lower end is inserted into a hole in the faceplate with sufficient pressure to deform the indium and seal the post hermetically to the faceplate.

However, the pressure required to deform the indium on the tapered post too often fractures the fragile glass faceplate.

It is therefore an object of the present invention to provide an electrical contact for use with an image signal pick-up tube which contact provides a hermetic seal with the faceplate of the image pick-up tube without placing excessive mechanical stress on the fragile faceplate.

It is another object of the invention to provide an electrical contact for use with the faceplate of an image signal pick-up tube wherein the contact is constructed to be free from defects due to corrosion.

It is still another object of the invention to provide an electrical contact for use with the faceplate of an image pick-up tube to make good electrical connection with an electrode on the interior surface of the faceplate.

SUMMARY OF THE INVENTION

In accordance with the present invention a fragile faceplate having at least one electrode layer deposited or formed on one surface thereof has a first metal layer on at least part of the electrode surface. The first metal layer is fixative or adherent for the electrode layer. A second metal layer, which is fixative or adherent for the first metal layer and is wettable by soldering metal, is formed on the exposed surface of the first metal layer, and a hole is bored through the faceplate in the proper location to pass through the electrode layer and both of the metal layers.

A pin with a shaft and an enlarged head is inserted into the hole with the head overlapping the immediately surrounding area of the second metal layer. At least the surface of the head adjacent the shaft, or the surface of the shaft adjacent the head, or both, is wettable by the same soldering material as the second metal layer. A ring of the soldering material encircles the shaft of the pin and is melted by heat treatment of the assembly to flow over the adjacent parts of the wettable surfaces of the shaft and head of the pin and the adjacent area of the second metal layer. The wettable surface of the exposed edge of the second metal layer also draws the molten soldering material. However, the non-wettable edges of the first metal layer prevent too much of the soldering material from being drawn down into the hole along the shaft of the pin.

The hermetic seal formed by the solder ring between the pin and the second metal layer completely encircles the pin. In addition, the adherence of the first metal layer to the electrode and of the second metal layer to the first, and the solder band between the second metal layer and the pin create an excellent conductive path between the pin and the electrode.

BRIEF DESCRIPTION OF THE DRAWINGS

FIG. 1 is a simplified side elevational view, partly in cross-section of a television image pick-up tube of a type with which the electrode structure of this invention can be used.

FIG. 2 shows the faceplate and electrodes and pin locations for the tube in FIG. 1.

FIG. 3 is a fragmentary cross-sectional view of a pin and faceplate arrangement.

FIG. 4 is a fragmentary cross-sectional view of a pin and faceplate arrangement that includes the structural features of the present invention.

DETAILED DESCRIPTION OF THE INVENTION

FIG. 1 shows a television image pick-up tube 1 that includes an electron gun 2. Such a tube is described in U.S. Pat. No. 3,688,020. The tube envelope comprises a transparent plate 3 and a tubular side wall within which the gun 1 is located. The tube envelope is evacuated.

The plate 3 is actually only the outer layer of a multi-layer faceplate structure. The plate 3 is thick enough to withstand atmospheric pressure and has excellent optical transmission characteristics. On the inner surface of the plate 3 is a striped color filter 4 to permit different color components to pass through only selected areas. The filter 4 is sandwiched between the relatively thick plate 3 and a much thinner glass plate 7. On the inwardly facing surface of the fragile glass plate 7 there is a transparent conductive electrode layer 5 and over the surface of the layer 5 is a photoconductive layer 6.

The tube 1 is shown in its deflection coil 8, which is surrounded by a focusing coil 9. An alignment coil 10 is spaced from the latter two coils toward the base, or gun, end of the tube. A lens 11 focuses an optical image of an object 12 on the photoconductive layer 6, for example, antimony trisulfide $Sb_2S_3$, so that as this layer is scanned by the electrode beam form the gun 1, a television signal may be formed, as is more fully described in the aforesaid U.S. Pat. No. 3,688.020.

FIG. 2 shows the electrode layer 5 in greater detail. It is actually divided into two transparent comb-shaped indexing electrodes 5A and 5B with interleaved teeth. This electrode arrangement may be formed by applying a tin oxide coating to the whole surface of the glass plate 7 and removing selected areas photoelectrically. Two conductive pins 13A and 13B extend through the glass plate 7 and through selected regions of the electrodes 5A and 5B. Such regions are conveniently, the backbone sections of the comb-shaped electrodes.

FIG. 3 shows a simplified pin structure somewhat similar to the structure more fully described in U.S. Pat. No. 3,854,069. The pin is shown only in broken lines and may be either the pin 13A extending through the electrode 5A or the pin 13B extending through the electrode 5B. The shaft of the pin appears to fit loosely in the hole bored through the faceplate comprising the plate 3, the filter 4, the electrode 5A or 5B, and the glass plate 7. Actually, a layer of indium is compressed between the shaft of the pin and the wall that defines the hole, and the indium is not only required to provide a hermetic seal between the pin and the faceplate but also the conductive connection between the pin and the respective electrode 5A or 5B. The head of the pin 13A or 13B is outside the tube 1 when the faceplate in FIG. 3 is assembled with other parts of the tube 1, so that not even the additional surface area of the underside of the head is available to improve the electrical connection. Furthermore, pushing the pin 13A or 13B with its tapered indium coating into the hole in the faceplate applies a force that tends to fracture the glass members, especially the fragile plate 7.

In the structure in FIG. 4 several of the parts are similar to those shown in FIG. 3 and are identified by similar reference characters. The faceplate structure has a hole, or channel, 14 through it corresponding to the hole in the structure in FIG. 3.

A first metal layer 15, which is fixative or adherent, for the transparent tin oxide conductive electrode 5A or 5B is selectively deposited by evaporation at about 200° to 300°C on at least a limited part of the electrode 5A or 5B. Suitable materials for use as the layer 15 are iron, chromium or nickel. These materials are not easily wettable by solder, such as a typical soft solder consisting of 60% tin and 40% lead, and so a second metal layer 16 is deposited by evaporation at about 200° to 300°C on the exposed surface of the first metal layer 15. The layer 16 is fixative or adherent for the first metal layer 15 and is wettable by solder. The second metal layer 16 may be selected from the group of noble metals consisting of gold, silver, platinum or palladium.

A conductive post, or pin, 18 is inserted into the hole. The pin may be made of copper, for example, with a gold coating electroplated on it. Before the shaft of the pin 18 is inserted into the hole 14, a ring of solder 19 is placed on the shaft. After these parts are assembled, the assembly is suitably heated, for example, by applying heat at about 200°C to the pin to melt the solder ring 19. The substrate plates 3 and 7 are heated but not as much as the pin 18, for example only to about 100°C. When the solder ring 19 melts, it easily wets the adjacent surfaces of the shaft and head of the pin 18 and of the second metal layer 16 so that the solder produces both a good hermetic seal and a good electrical connection between the pin and the layer 16. The pin 18 has an enlarged head 17, which contrary to the structure in FIG. 3 is on the same side of the faceplate structure as the electrode 5A or 5B and thus provides a greater surface area for electrical connection with the solder. The solder does not wet the other materials of the faceplate and so is not drawn away from the area of the pin adjacent the head 17.

While this invention has been described in specific terms, it will be understood by those skilled in the art that modifications may be made therein within the true scope of the invention as defined by the following claims.

What is claimed is:
1. An electrode structure comprising:
   A. a fragile transparent non-conductive substrate;
   B. a transparent electrode on one surface of said substrate;
   C. a first metal layer on the exposed surface of a section of said electrode, said first metal layer being selected from the group consisting of iron, chromium, and nickel;
   D. a second metal layer on the exposed surface of said first metal layer, said second metal layer being selected from the group of noble metals consisting of gold, silver, platinum and palladium;
   E. a hole extending through both of said metal layers and the electrode underneath and the substrate;
   F. a metal pin; and
   G. solder encircling said pin and solidified into joining relationship with said pin and said second layer.

2. The invention as defined in claim 1 in which said first layer is iron.
3. The invention as defined in claim 1 in which said second layer is gold.
4. The invention as defined in claim 1 in which said pin is copper and is plated with a noble metal.
5. The invention as defined in claim 1 in which said pin comprises:
   A. a shaft extending through said hole;
   B. an enlarged head of greater cross-sectional area than said hole; and
   C. a conductive surface wettable by said solder at least in the region of intersection between the shaft of said pin and the enlarged head.
6. A photo-electric structure comprising:
   A. a glass substrate;
   B. first and second interleaved transparent Nesa electrodes on one surface of said substrate electrically insulated from each other;
   C. a first metal layer on one section of the exposed surface of each of said first and second electrodes, said first metal layer being selected from a group consisting of iron, chromium and nickel;
   D. a second metal layer on the exposed surface of said first metal layer on each of said first and second electrodes, said second metal layer being selected from the group of noble metals consisting of gold, silver, platinum, and palladium;
   E. first and second holes extending through said glass substrate, said first hole also extending through said first electrode and through the respective first and second metals layers on said first electrode, and said second hole also extending through said second electrode and through the respective first and second metal layers on said second electrode;
   F. first and second copper pins each comprising:
      1. a shaft extending through one of said first and second holes, respectively,
      2. an enlarged head of greater cross-sectional area than the respective hole, and
      3. a gold coating wettable by solder comprising an alloy of tin and lead; and
   G. first and second rings of said solder, each encircling a respective one of said pins and solidified into joining relationship between a respective pin and the respective portion of said second layer.

* * * * *